(12) United States Patent
Barr et al.

(10) Patent No.: US 6,967,850 B2
(45) Date of Patent: Nov. 22, 2005

(54) SUPPORTING A SHORT PRINTED CIRCUIT CARD

(75) Inventors: Andrew Harvey Barr, Roseville, CA (US); Robert William Dobbs, Granit Bay, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/618,966

(22) Filed: Jul. 14, 2003

(65) Prior Publication Data

US 2005/0013123 A1 Jan. 20, 2005

(51) Int. Cl.[7] .............................. H05K 7/14; H05K 7/18
(52) U.S. Cl. ...................... 361/802; 361/686; 361/732; 361/740; 361/742; 361/747; 361/758; 361/759; 361/801; 439/377
(58) Field of Search ................................ 361/683–686, 361/728, 732, 736, 740, 741, 742, 747, 748, 361/752, 756, 758, 759, 801, 802; 439/377; 211/41.17; 248/241, 244, 245, 309.1

(56) References Cited

U.S. PATENT DOCUMENTS

| | | | | |
|---|---|---|---|---|
| 3,733,523 A | * | 5/1973 | Reynolds et al. | 361/802 |
| 4,068,290 A | * | 1/1978 | Wetherbee | 361/802 |
| 4,198,024 A | * | 4/1980 | Cavanna | 248/544 |
| 4,979,075 A | * | 12/1990 | Murphy | 361/686 |
| 5,383,793 A | * | 1/1995 | Hsu et al. | 439/327 |
| 5,706,173 A | * | 1/1998 | Carney et al. | 361/740 |
| 5,883,792 A | | 3/1999 | Summers et al. | |
| 6,125,044 A | | 9/2000 | Cherniski et al. | |
| 6,169,662 B1 | | 1/2001 | Clark et al. | |
| 6,201,711 B1 | | 3/2001 | Cherniski et al. | |
| 6,320,760 B1 | | 11/2001 | Flamm et al. | |
| 6,414,851 B2 | | 7/2002 | Cherniski et al. | |

* cited by examiner

*Primary Examiner*—Phuong T. Vu

(57) ABSTRACT

A short card support for supporting a short printed circuit card insertable into an electronic system is disclosed. The short card support has a card guide end adapted to couple to the card guide of the electronic system and a card receptor end adapted to couple with a first edge of the short printed circuit card. A support span between the card guide end and the card receptor end permits the short card support to accommodate varying lengths of short printed circuit cards.

37 Claims, 5 Drawing Sheets

SUPPORTING A SHORT PRINTED CIRCUIT CARD

BACKGROUND

Expansion cards are inserted into a card bay in an electronic system, such as a computer system, to enable one or more microprocessors to be connected to external devices. Generally, expansion cards permit expanded performance from a computer system through connection with external devices. A peripheral component interconnect (PCI) system is one example of a system configured to expand the utility of a computer system through connection with external devices. A PCI system includes PCI slots that are externally accessible for reception of PCI cards. PCI cards are inserted into a card bay of the PCI system. Compatible external devices can be plugged into the PCI cards, which are one type of expansion card. Expansion cards that do not span the full length of the card bay that they are inserted into are known as short cards.

A computer system typically comprises a chassis for structural support, a central processing unit (CPU), various cooling fans, a card bay to house removable printed circuit assemblies (PCA), and an array of other electrical components. The card bay is designed to receive removable printed circuit cards, such as input/output (I/O) cards. The card bay provides card guides on one side that are aligned to coordinate with the bulkhead guides on the opposing, or bulkhead, side. In practice, an expansion card would typically be inserted into the computer system card bay by coupling one edge of the expansion card to the bulkhead guide and coupling the opposing edge of the expansion card to the complementary card guide on the other side of the card bay. The expansion card is then mechanically and electrically coupled to the computer at the backplane, or mid-plane, or generally, at the connector plane. Therefore, a card that spans the full length of the card bay is typically supported on three edges.

Expansion cards are uniquely configured to support specific applications, and hence, not all expansion cards are the same size. Indeed, some expansion cards do not span the full length of the card bay of the computer system. Such expansion cards, known as short cards, are supported only on two edges; the one edge mechanically coupled by the bulkhead guide and the second edge mechanically and electrically coupled to the connector plane. Therefore, short cards installed in a computer system have at least one unsupported edge and are susceptible to bending and damage when subjected to harsh forces.

A computer system suitable for service in a harsh environment, especially a computer system employed in telecommunications, is typically qualified for operation in the harsh environment. Harsh environments can be encountered in deploying mobile computers, such as computers mounted on delivery trucks, machine shop applications where the computers are subjected to vibrations, computer systems located in earthquake zones, and any situation that would subject the computer system to bumps, drops or large amplitude vibrations. The military and government agencies deploy a wide variety of computers and telecommunication equipment in diverse environments, and the military and government agencies encourage suppliers to employ both widely available components and cards, as well as the best value components and cards. Consequently, short cards are often installed in computer and telecommunication systems that are subjected to harsh environments. In addition, implementation of these computer and telecommunication systems is subject to qualification with certain performance specifications.

Performance specifications for a variety of measurable system parameters can be specified by the military or government agencies, or by industry groups. For example, all electronic equipment has the potential to interfere with other electronic equipment. Interference can be caused by electromagnetic radiation, the grounding system, the electrical power connection, excessive heat or insufficient airflow, and connecting wires or cables. The Federal Communications Commission (FCC) regulates a portion of this through Part 15 of their rules and regulations. FCC Part 15 specifies a maximum allowable amount of electromagnetic radiation from an electronic device in a commercial or residential environment at specific frequencies.

Network Equipment Building System (NEBS) is an industry standard that addresses the issue of collocated electronic equipment. Telephone companies typically place a large amount of network equipment, often from different manufacturers, into relatively tight association especially in their central office buildings. To account for this, they gathered input from the FCC and various national and international trade and standards groups to create a set of specifications for network facilities-located equipment. Originally developed by Bell Telephone laboratories in the 1970s and expanded by Bellcore, this standard is known as NEBS, or NEBS criteria.

The rigorous NEBS criteria have become a universal measure of network product excellence. NEBS compliance is required for equipment deployed in the central office in the North American Public Switched Network. NEBS compliance is an advantage for access providers including Local Exchange Carriers (LECs), Competitive Access Providers (CAPs), Competitive Local Exchange Carriers (CLECs), Internet Service Providers (ISPs), and Access Service Providers (ASPs). Products that are NEBS compliant are also expected to be top performers in network environments. The NEBS criteria are the most referenced documents in the United States Telecommunications Industry on the subject, and are designed to help ensure that telecom equipment is easy to install, operates reliably, and efficiently occupies building space. The expectation is that specifications for equipment configuration and compatibility will simplify product installation and reduce maintenance costs.

Regional operating companies and inter-exchange carriers insist upon NEBS compliance. NEBS is a baseline for vendor selection and deployment by service providers such as CLECs, ISPs, and independent telephone companies and others.

Even more stringent than the FCC Part 15 requirements, NEBS addresses a wide range of parameters related to personal safety, protection of property, and operational continuity. The NEBS criteria specifies parameters for space planning, temperature, humidity, fire, earthquake, vibration, transportation, acoustics, air quality, and illumination as well as electrostatic discharge (ESD), electromagnetic interference (EMI), lightning and AC power fault, steady state power induction, corrosion, direct current potential difference, and electrical safety in configuring telecommunication devices.

With the above in mind, one approach that the computer system industry has taken is to select and insert a best value short card and leave it unsupported on one edge. This method allows a wide variety of cards to be installed in the computer systems and enables the manufacturers to select the best value components. However, when the short cards are unsupported on one edge, the computer system is unlikely to meet the NEBS criteria for use in harsh environments, and so, the lack of robustness limits the utility of the computer system in the marketplace.

Another approach taken by the computer system industry is to select only full-length cards that will be supported on three edges by the bulkhead guides, card guides, and the connector plane. This approach ensures that the full-length cards are adequately supported, but limits the selection and value of the cards that may be installed in the computer system. Therefore, the computer system may meet the NEBS criteria, but may not offer the consumer the breadth of applications they require and may not offer sufficient value.

For the reasons stated above and for other reasons presented in this disclosure, a need exists for computer systems qualified for use in harsh environments that employ varying length printed circuit cards including short cards.

SUMMARY

One aspect of the present invention provides a short card support for supporting an unsupported edge of a short printed circuit card inserted into an electronic system. The short card support includes a card guide end adapted to couple to a card guide of the electronic system and a card receptor end adapted to couple with the unsupported edge of the short printed circuit card. A support span is provided that connects between the card guide end and the card receptor end.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

Figure 1:
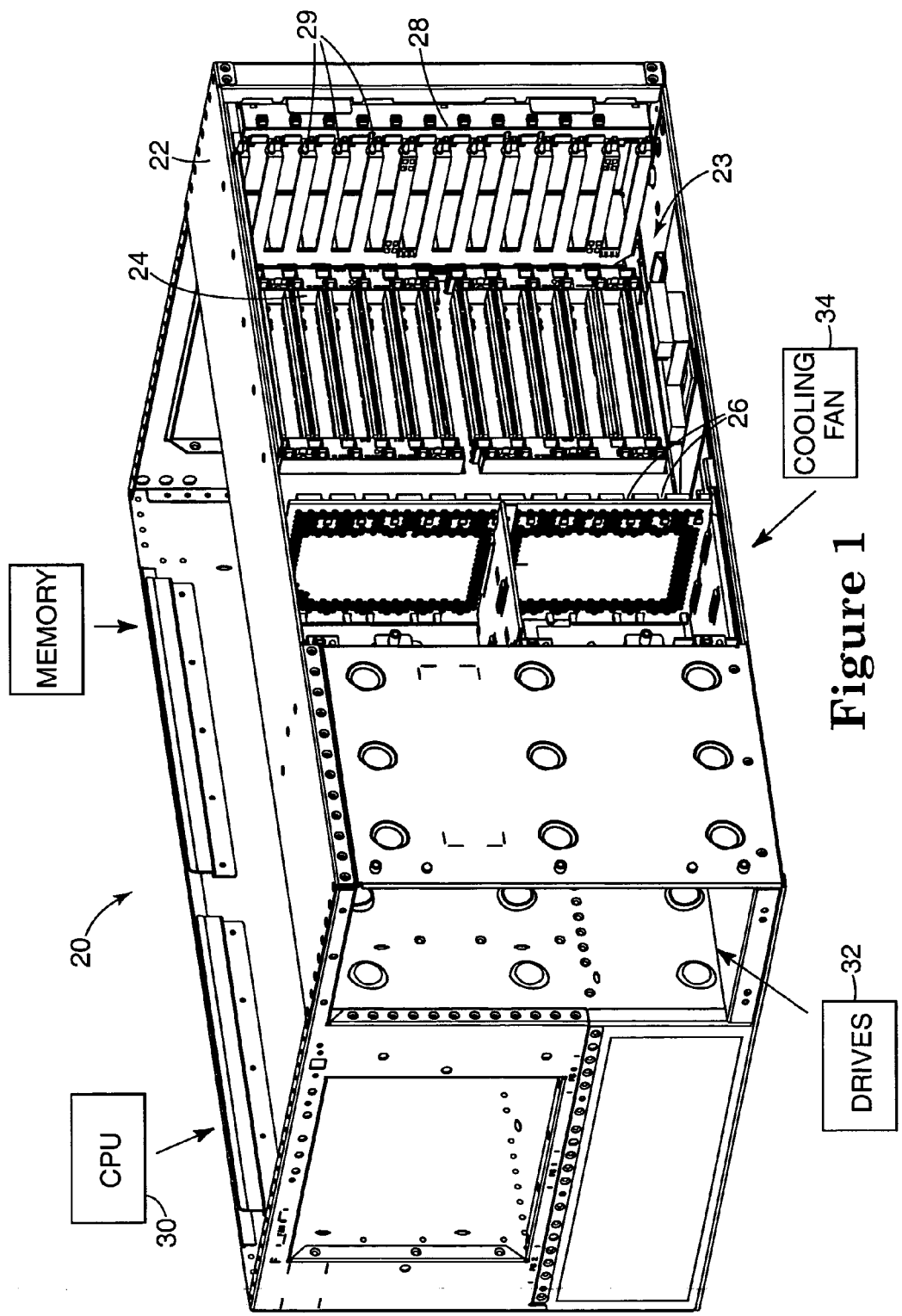
FIG. 1 is perspective view of one embodiment of a computer system having card guides and a connector plane.

One embodiment of a computer system is generally illustrated at 20 in FIG. 1. The following detailed description describes various embodiments of the present invention implemented in computer systems, but the present invention can be implemented in other types of electronic systems. Computer system 20 includes a chassis 22, a card bay 23, connector plane 24, card guides 26, and a bulkhead side 28 having bulkhead guides 29. In the illustrated embodiment, connector plane 24 is a back plane. Other embodiments of a computer system include a mid-plane connector plane. Computer system 20 includes a central processing unit (CPU) 30, drives 32, cooling fan 34, and various other components associated with computer systems.

Full-length printed circuit cards (i.e., expansion cards or simply cards) are inserted into the card bay 23 by coupling the cards to card guides 26 on an interior side and to bulkhead guides 29 on a bulkhead side. Card guides 26 and bulkhead guides 29 mechanically couple inserted printed circuit cards to computer system chassis 22. Printed circuit cards are electrically and mechanically coupled to the computer system at connector plane 24. Therefore, printed circuit cards that span the full length of card bay 23 are mechanically coupled by card guides 26 and bulkhead guides 29, and electrically and mechanically coupled to computer system 20 by connector plane 24. However, printed circuit cards have varying lengths. Printed circuit cards that do not span the full length between card guides 26 and bulkhead guides 29 are known as short printed circuit cards, or short cards. Short cards are mechanically coupled on one edge by bulkhead guide 29 and electrically and mechanically coupled on a second edge to computer system 20 by connector plane 24. Therefore, short cards are supported on only two edges and unsupported on two edges. Accordingly, short cards are susceptible to deflection and damage when subjected to dropping, strong vibrations, earthquakes, mobile deployment, or bumps, or other harsh environmental conditions.

Figure 2:
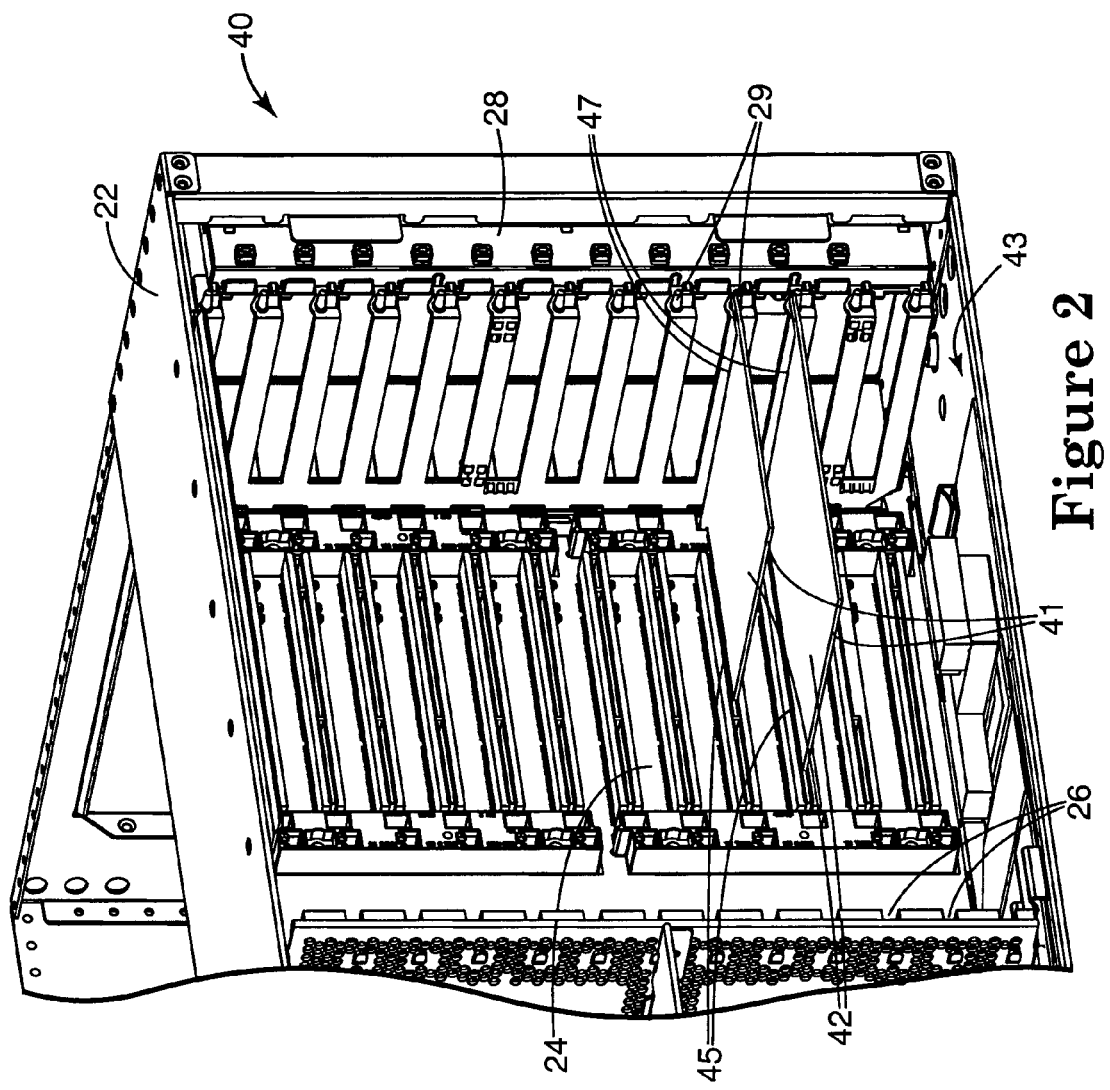
FIG. 2 is a perspective view of the computer system of FIG. 1 having short printed circuit cards inserted.

A computer system having short printed circuit cards (short cards) inserted is generally illustrated at 40 in FIG. 2. Short cards 42 have connector edges 45 configured to electrically and mechanically couple with connector plane 24 and bulkhead edges 47 configured to mechanically couple to the bulkhead guides 29 on bulkhead side 28. When short cards 42 are inserted into computer system 40, short cards 42 have an interior edge 41 which is unsupported. As illustrated in FIG. 2, an inserted short card 42 is mechanically coupled at connector edge 45 and bulkhead edge 47, but interior edge 41 is unsupported and free to move in the vertical plane.

Inserted short cards 42 that are unsupported on interior edge 41 reduce the likelihood that computer system 40 will meet the NEBS criteria discussed in the Background section of the present application and increase the potential for computer system failure. For example, the unsupported interior edge 41 of short card 42 could deflect under certain conditions and touch an adjacent card. Therefore, interior edge 41 presents a potential risk for card-to-card touching that could lead to catastrophic electrical shorting of computer system 40. Under extreme shock and vibration conditions such as environmental testing, forklift drops, dropping, earthquakes, or mobile deployment of computers, interior edge 41 could slap adjacent cards or card slot separators and/or portions of computer chassis 22. This slapping can damage to short card 42 and also damage other computer components.

Figure 3:
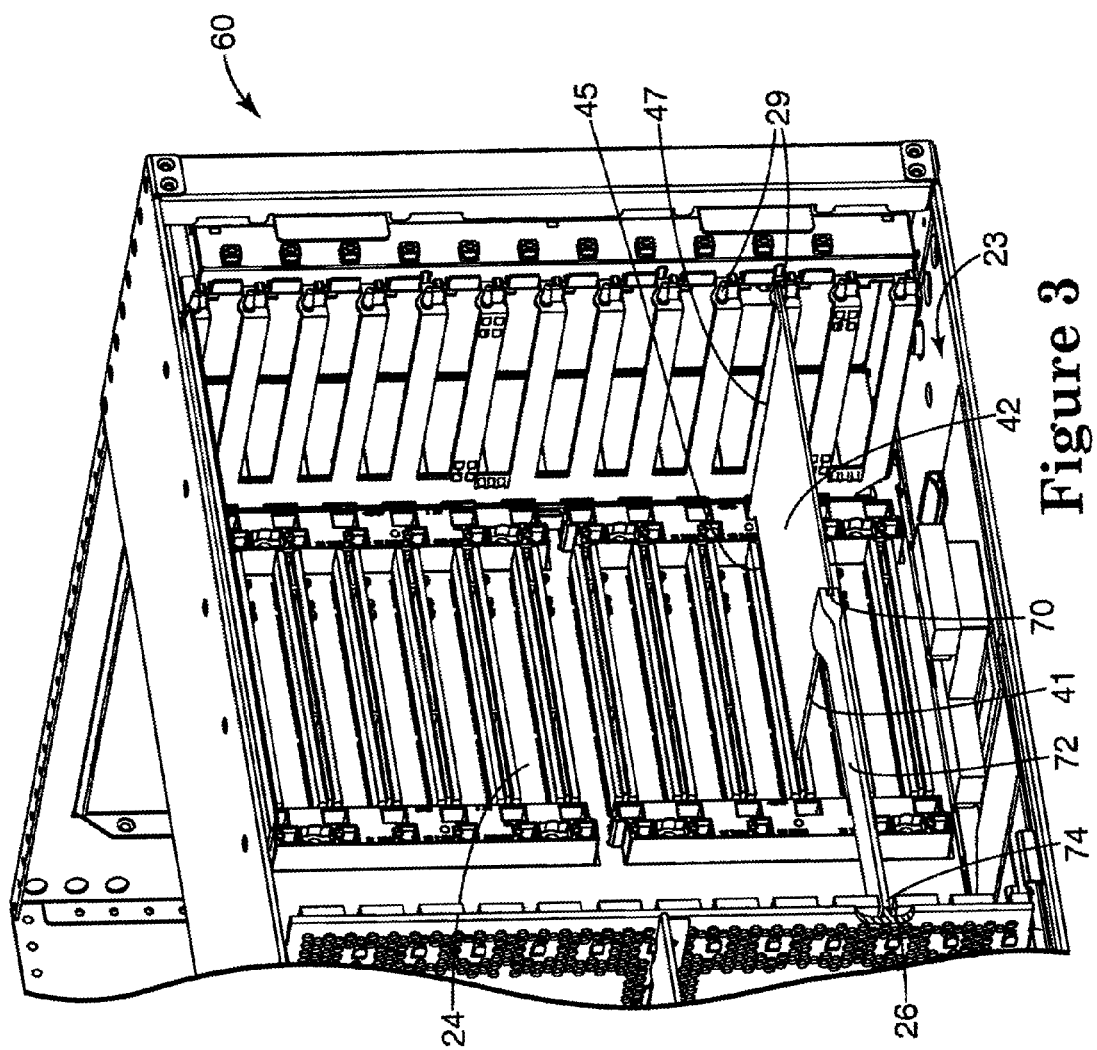
FIG. 3 is a perspective view of a computer system having a short card support inserted according to one embodiment of the present invention.

A short card support 72 supporting a short card 42 according to one embodiment of the present invention is illustrated generally at 60 in FIG. 3. Short card supports according to the present invention, such as short card support 72, support short cards inserted into computer systems, or other electronic systems, of varying lengths shorter than full-length while enabling the computer system, or other electronic systems, to reliably operate in harsh environments. Short card 42 is mechanically coupled to bulkhead guide 29 on bulkhead edge 47 and mechanically and electrically coupled to connector plane 24 on connector edge 45. Short card support 72 has a card receptor end 70 configured to receive interior edge 41 of short card 42 and a card guide end 74 configured to couple to card guides 26 of computer system 60. In this manner, interior edge 41 of short card 42 is supported by card receptor end 70 of short card support 72. In one embodiment, short card 42 has interior edge 41 supported and mechanically coupled to card bay 23 via short card support 72.

Card receptor end 70 is adapted to couple with the unsupported interior edge 41 of short cards 42. Consequently, card receptor end 70 is sized to accommodate interior edges 41 having varying thickness. One suitable geometry for card receptor end 70 is a wedge-shape, or V-shape (as viewed in cross section). In one embodiment, interior edge 41 of short card 42 nestles into a wedge-shape, or V-shape, of card receptor end 70 such that interior edge 41 is frictionally engaged with, and supported by, short card support 72. Alternately, card receptor end 70 can be configured to be width-adjustable so as to expand or contract to accept short cards 42 having varying thickness.

Short card support 72 rigidly spans the distance between card guide 26 and interior edge 41 of short card 42. As a result, short card support 72 enables the secure support of short cards 42 inserted into card bay 23. Short card support 72 is illustrated as a rigid span in FIG. 3, supporting one specific length of short card 42. In this type of embodiment, multiple fixed-length short card supports 72 of different lengths are employed to accommodate varying length short cards 42. In one embodiment, a short card 42 and a short card support 72 together combine to define a short printed circuit card assembly. In other embodiments, short card support 72 is configured to accommodate short cards 42 having widely varying lengths by having an adjustable span.

Since short cards 42 vary in length, some short cards 42 are nearly the same length as a full-length card and some short cards 42 are appreciably shorter. To better accommodate these widely varying length short cards 42, in one embodiment, short card support 72 is manufactured in at least a long and a short version. In one embodiment, the long version of short card support 72 has a span suitable for spanning the distance from card guide 26 to interior edge 41 of the appreciably shorter short card 42. In one exemplary embodiment, the long version of short card support 72 has a length of approximately 6 inches. In one embodiment, the short version of short card support 72 has a span suitable for spanning the distance from card guide 26 to interior edge 41 of a comparatively long short card 42. In one exemplary embodiment, the short version of short card support 72 has a length of approximately 2 inches. In any of its forms, short card support 72 is configured to rigidly span the distance from card guide 26 to interior edge 41 of short card 42. In one embodiment where short card 42 is a peripheral component interconnect (PCI) card, short card support 72 spans a distance corresponding to a range of approximately 15% to 50% of the card bay 23 length. In another embodiment, short card support 72 spans a distance corresponding to a range of approximately 10% to 90% of the card bay 23 length. In one embodiment, short card support 72 has a fixed length of less than approximately 12 inches. In some embodiments, short card support 72 has an adjustable span, such that card receptor end 70 can be selectively positioned to accommodate short cards 42 of varying length. Various adjustable supports having adjustable spans according to embodiments of the present invention are described below.

Figure 4:
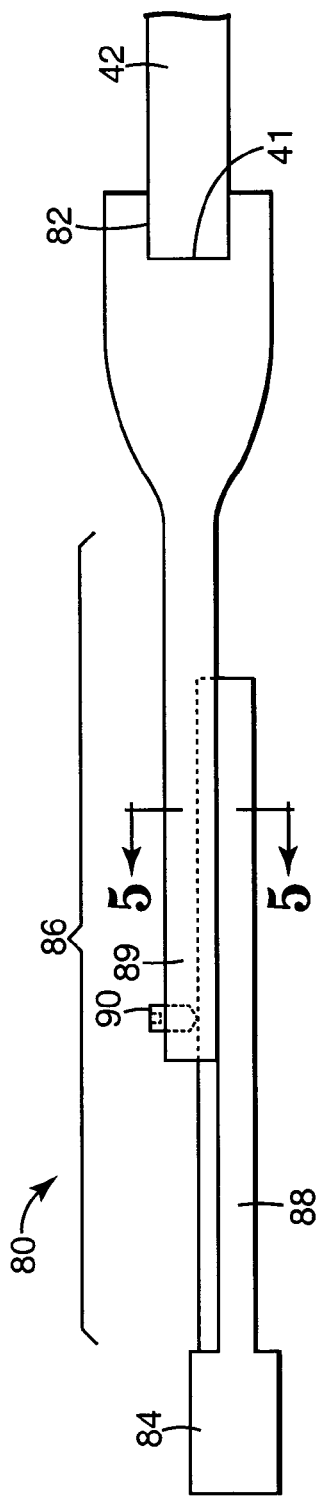
FIG. 4 is an expanded view of an adjustable short card support according to another embodiment of the present invention.
Figure 5:
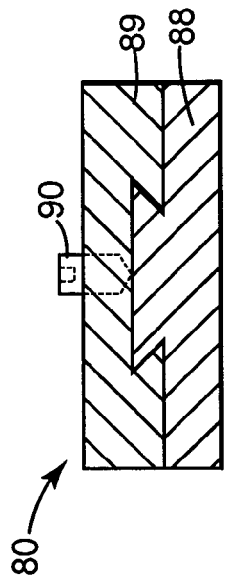
FIG. 5 is a cross sectional end view of the adjustable short card support of FIG. 4 taken along lines 5—5.

An adjustable short card support 80 having an adjustable span 86 according to one embodiment of the present invention is illustrated in FIGS. 4 and 5. FIG. 5 is a cross-sectional end view of the adjustable span 86 illustrated in FIG. 4. Adjustable short card support 80 has a card receptor end 82 suited for coupling with interior edge 41 of short card 42, and a card guide end 84 suited for coupling to card guides 26. Adjustable short card support 80 is adjustable along an adjustable support span 86. In one embodiment, adjustable support span 86 spans a length between card guides 26 and interior edge 41 of short card 42. In one embodiment, adjustable support span 86 provides a tongue side 88 that is slideably coupled to a groove side 89. A positioning device 90 is located on groove side 89 to selectively secure adjustable support span 86 at a desired span length. In this manner, positioning device 90 permits adjustable support span 86 to be selectively positioned so as to span between short card 42 and card guides 26. In one embodiment, the adjustable support span 86 length is selectively adjustable in a range from approximately 2 to 6 inches to accommodate and support short cards 42 having lengths ranging from approximately 10 to 6 inches, respectively. In another embodiment, adjustable support span 86 length is selectively adjustable in a range from approximately 10% to approximately 90% of the length of card bay 23. In one embodiment, a short card 42 and an adjustable short card support 80 together combine to define a short printed circuit card assembly. Accordingly, adjustable short card support 80 can be span-adjusted to accommodate and support short cards 42 having varying lengths.

As illustrated in FIG. 4, positioning device 90 secures adjustable short card support 80 at a selected span length Positioning device 90 can be disengaged to enable card receptor end 82 to be extended to, and coupled with, short card 42. In one embodiment, adjustable support span 86 is adjustable in a way that permits card guide end 84 to be first coupled to card guides 26 and then card receptor end 82 to be extended to couple to interior edge 41 of short card 42. Positioning device 90 is then engaged to securely maintain the selected length of adjustable support span 86. As a result, adjustable short card support 80 is selectively positioned between card guides 26 and interior edge 41 of short card 42 such that interior edge 41 is rigidly supported (i.e., prevented from substantially moving in the vertical plane). Example embodiments of positioning device 90 include but are not limited to a pin mechanism, a clasp, a latch, a stop assembly, a detent, a catch mechanism, or any secural device suited for fixing adjustable support span 86 in the desired extended position. Other suitable mechanisms for securing adjustable support span 86 can be employed to achieve selective positioning of adjustable short card support 80.

Positioning device 90 can be loosened to allow the adjustable short card support 80 to collapse along adjustable support span 86 and be de-coupled, or separated, from short card 42. When positioning device 90 is loosened, tongue side 88 and groove side 89 slide along each other. When tongue side 88 is collapsed into groove side 89, adjustable short card support 80 is shortened, permitting access to short card 42 for removal or diagnostic activity.

Figure 6:
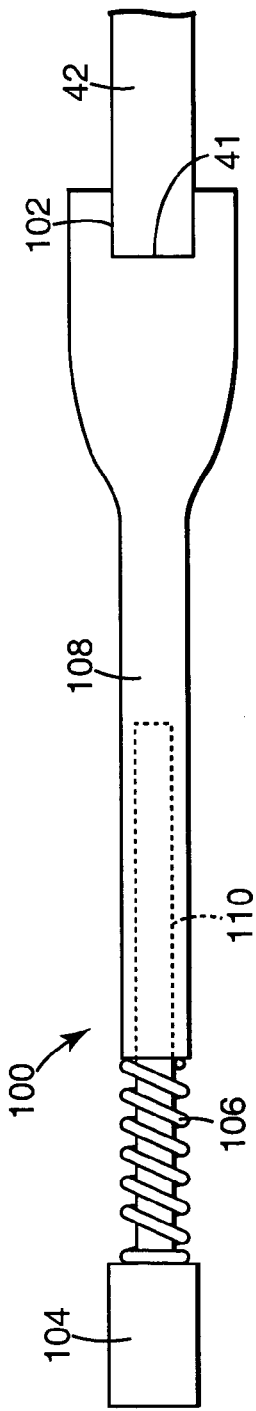
FIG. 6 is an expanded view of an adjustable short card support according to another embodiment of the present invention.

Diagnostic or service-related activity is typically conducted with computer systems on a routine basis. Such computer system servicing can be beneficially affected through the utilization of an adjustable short card support that extends and contracts along its length with a minimum of effort. With this in mind, FIG. 6 illustrates a telescoping adjustable short card support 100 according to an embodiment of the present invention. Telescoping adjustable short card support 100 couples with card guides 26 via a card guide end 104, and a card receptor end 102 that couples with interior edge 41 of short card 42. In one embodiment, telescoping adjustable short card support 100 has a variable span length provided by a spring force. For example, spring 106 exerts a force in selectively separating card guide end 104 and receptor arm 108 thereby defining a span length of adjustable short card support 100.

In one embodiment, spring 106 is co-axially mounted around a card guide arm 110. When inserted into card bay 23, receptor arm 108 is forced apart from card guide arm 110 by spring 106 and delivers unto short card 42 a coupling force proportional to a selected spring constant. Short card 42 is thus secured within card bay 23 by the selected force provided by spring 106. In a servicing operation, adjustable short card support 100 can be retracted from short card 42 by the application of a force sufficient to compress spring 106 and de-couple card receptor end 102 from interior edge 41.

Other techniques of extension for telescoping adjustable short card support 100 could be employed. In one exemplary embodiment, card guide arm 110 is threaded into receptor arm 108 to allow card receptor end 102 to be extended to couple with short card 42. Suitable techniques for selectively lengthening telescoping adjustable short card support 100 include but are not limited to spring tension, threaded pieces, bolts, tension devices, screws, pins, locking nuts, off-set devices that couple with pre-positioned notches, friction assemblies, friction rings, and detents. In addition, other suitable mechanisms can be employed to selectively maintain a selected span length for adjustable short card supports.

Short card support 72 and adjustable short card supports 80 and 100 are designed to be compatible with card bays 23 having card slot separators. In one exemplary embodiment illustrated in FIG. 7, computer system 60 includes a card slot separator 112 and short card 42 supported by an adjustable short card support 80. Card slot separators 112 are a physical barrier positioned between expansion cards to mitigate card touching, either during routine servicing of computer system 60 or during actual operation of the computer system 60. However, card slot separators 112 do not typically decrease the deflection of short cards 42 that are installed in computer system 60. Card slot separators 112, however, decrease the likelihood that electrically coupled cards will touch if deflection occurs, which could lead to catastrophic failure of the computer system. Adjustable short card supports described herein, for example 72, 80, and 100, function independently from, but are compatible with, card slot separators 112. Thus, these adjustable short card supports can be implemented with or without card slot separators.

Figure 7:
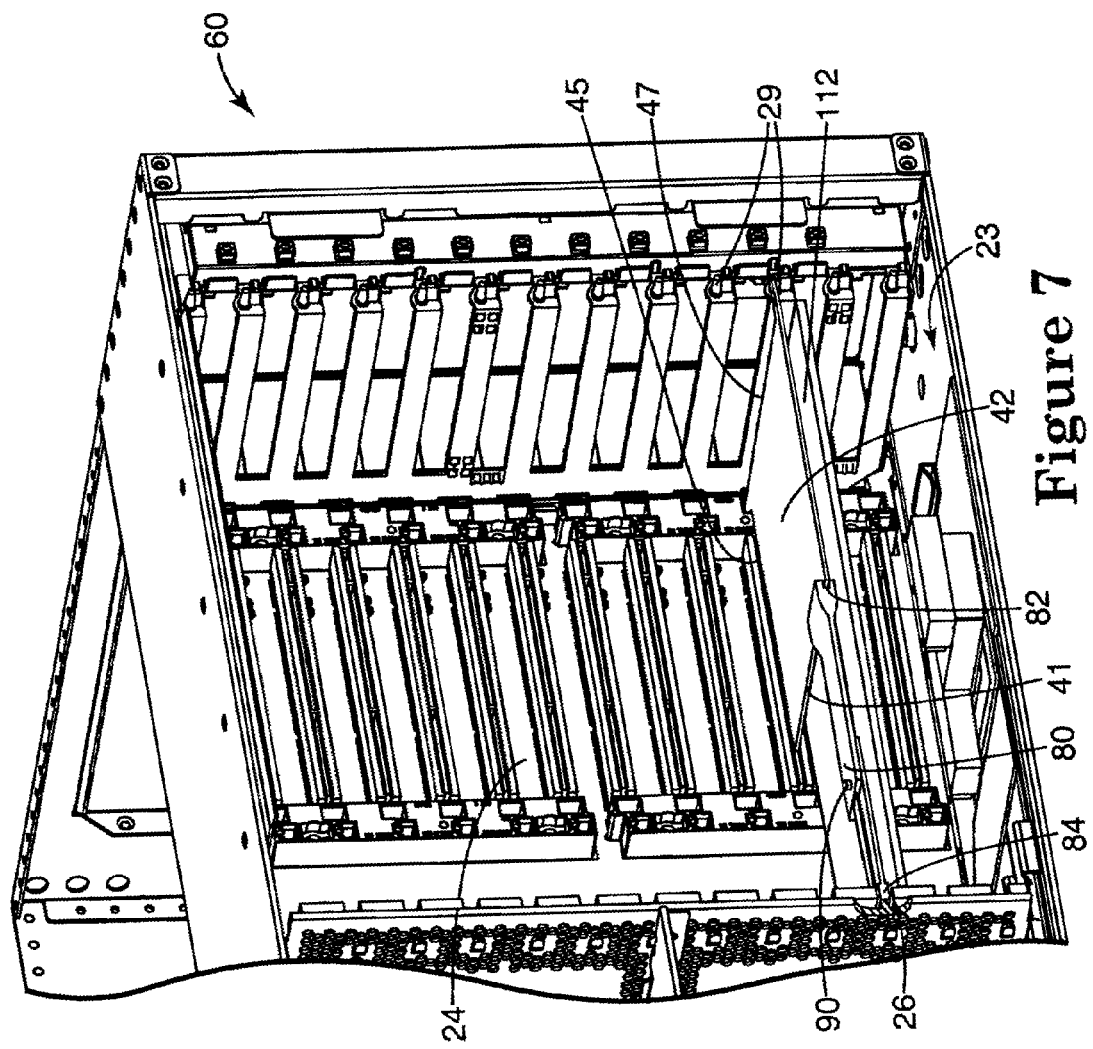
FIG. 7 is a perspective view of a computer system having a card slot separator illustrating an inserted adjustable short card support according to one embodiment of the present invention.

Short card support 72 and adjustable short card supports 80 and 100 are compatible with the practice of hot-swapping cards into and out of a computer system. Hot swapping refers to removing and/or inserting a printed circuit card from the computer system while the computer system is electrically powered. In one embodiment, short cards 42 are hot swapped with computer system 60 via manipulation of short card support 72 (FIG. 3). For example, one method of hot swapping includes sliding short card 42 out of card receptor end 70 of short card support 72 and along bulkhead guides 29 as short card 42 is electrically and mechanically uncoupled from connector plane 24. Short card support 72 supports interior edge 41 against deflection, but short card 42 can be moved out of the plane of card bay 23 via a sliding action. In another embodiment, short cards 42 are hot swapped with computer system 60 via manipulation of adjustable short card support 80 (FIG. 7). For example, adjustable short card support 80 can be moved away from short card 42 by loosening positioning device 90. Positioning device 90 is loosened such that card receptor end 82 can be moved away from short card 42, allowing access to short card 42. Short card 42 is then uncoupled from bulkhead guides 29 and electrically and mechanically uncoupled from connector plane 24. Since adjustable short card support 80 permits improved access to short card 42 after card receptor end 82 is uncoupled from short card 42, control of short card 42 is improved and hot-swapping of short card 42 is both quick and convenient.

In one embodiment, short card support 72 and adjustable short card supports 80 and 100 are comprised of electrically non-conductive and non-inflammable material. Suitable electrically non-conductive and non-inflammable materials include plastics generally, including but not limited to thermo-plastics, particle filled plastics, sintered materials and inorganic materials. Other suitable materials can be employed to manufacture short card supports as described herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A short card support for supporting a short printed circuit card inserted into an electronic system having a pair of opposing card guides adapted to support a full length printed circuit card, wherein the pair of opposing card guides includes a first card guide and a second card guide, the short printed circuit card having a card guide edge adapted to couple to the first card guide and a first edge not coupled to the electronic system, the short card support comprising:

a card guide end adapted to insert into the second card guide;

a card receptor end adapted to couple with the first edge of the short printed circuit card; and a support span connecting the card guide end and the card receptor end.

2. The short card support of claim 1, wherein a span length of the short card support is adjustable.

3. The short card support of claim 2, wherein a card bay length is defined as a distance between the first card guide and the second card guide and the adjustable span length is selectively adjustable in a range from approximately 10% to 90% of the card bay length.

4. The short card support of claim 2, wherein the adjustable span length is selectively adjustable in a range from approximately 2 to 6 inches.

5. The short card support of claim 1, wherein the short card support is made from an electrically non-conducting material.

6. The short card support of claim 5, wherein the electrically non-conducting material is selected from the group consisting of plastics, particle filled plastics, sintered materials, and inorganic materials.

7. The short card support of claim 1, wherein short card support is made from non-inflammable material.

8. The short card support of claim 1, wherein the short card support has a fixed length of less than 12 inches.

9. The short card support of claim 1, wherein the card receptor end is width adjustable to accommodate varying thickness short cards.

10. A short printed circuit card assembly insertable into an electronic system having a pair of opposing card guides adapted to support a full length printed circuit card, the pair of opposing card guides including a first card guide and a second card guide, the short printed circuit card assembly comprising:
   a printed circuit card having a card guide edge adapted to couple to the first card guide, and a first edge; and
   a card support configured to couple to the first edge of the printed circuit card, the card support including:
      a card guide end adapted to insert into the second card guide,
      a card receptor end adapted to couple to the first edge of the printed circuit card, and
      a support span connecting the card guide end and the card receptor end.

11. The short printed circuit card assembly of claim 10, wherein a span length of the support span is adjustable.

12. The short printed circuit card assembly of claim 11, wherein a card bay length is defined as a distance between the first card guide and the second card guide and the adjustable span length is selectively adjustable in a range from approximately 10% to 90% of the card bay length.

13. The short printed circuit card assembly of claim 11, wherein the adjustable span length is selectively adjustable in a range from approximately 2 to 6 inches.

14. The short printed circuit card assembly of claim 10, wherein the short card support is made from an electrically non-conducting material.

15. The short printed circuit card assembly of claim 14, wherein the electrically non-conducting material is selected from the group consisting of plastics, particle filled plastics, sintered materials, and inorganic materials.

16. The short printed circuit card assembly of claim 10, wherein the card receptor end is width adjustable to accommodate varying thickness short cards.

17. The short printed circuit card assembly of claim 10, wherein the support span has a fixed length of less than 12 inches.

18. A short printed circuit card assembly inserted into an electronic system having a pair of opposing card guides adapted to support a full length printed circuit card, the pair of opposing card guides including a first card guide and a second card guide, the short printed circuit card assembly comprising:
   a printed circuit card mechanically coupled to the electronic system on a first edge and mechanically and electrically coupled to the electronic system on a connector edge; and
   a printed card support comprising a card guide end inserted into the second card guide opposite the first edge, a card receptor end coupled with a second edge of the printed circuit card, and a support span connecting the card guide end and the card receptor end.

19. The short printed circuit card assembly inserted into an electronic system of claim 18, wherein a span length of the printed card support is adjustable.

20. The short printed circuit card assembly inserted into an electronic system of claim 18, wherein the support span has a fixed length of less than 12 inches.

21. The short printed circuit card assembly inserted into an electronic system of claim 18, wherein the card receptor end is width adjustable to accommodate varying thickness short cards.

22. A short card support for supporting a short printed circuit card adapted to couple to an electronic system defining a first card guide and an opposing second card guide which are together adapted to support a full length printed circuit card, the short printed circuit card having a card guide edge adapted to couple to the first card guide and a first edge, the short card support comprising:
   a card guide end adapted to insert into the second card guide of the electronic system;
   a card receptor end adapted to couple with the first edge of the short printed circuit card;
   a support span connecting the card guide end and the card receptor end; and
   means for selectively positioning the card receptor end for reception of the first edge of the short printed circuit card.

23. The short card support of claim 22, wherein the means for selectively positioning the card receptor end includes a stop assembly.

24. The short card support of claim 22, wherein the means for selectively positioning the card receptor end includes a clasp.

25. The short card support of claim 22, wherein the means for selectively positioning the card receptor end includes a pin.

26. A method of supporting a short printed circuit card having a first edge, a second edge, the short printed circuit card insertable into an electronic system having a pair of opposing card guides adapted to support a full length printed circuit card, the method comprising:
   coupling the first edge of the short printed circuit card to a first card guide of the electronic system; and
   supporting the second edge of the short printed circuit card with a short card support comprising a card receptor end removably attached to the second edge of the short printed circuit card, a card guide end adapted to removably insert into a second card guide of the electronic system, and a support span connecting the card receptor end and the card guide end.

27. The method of supporting a short printed circuit card insertable into an electronic system of claim 26, wherein the short printed circuit card includes a connector edge insertable into a connector plane of the electronic system.

28. The method of supporting a short printed circuit card insertable into an electronic system of claim 27, wherein the method further comprises electrically and mechanically coupling the connector edge of the short printed circuit card to the connector plane of the electronic system.

29. The method of supporting a short printed circuit card insertable into an electronic system of claim 26, wherein the method includes adjusting a span length of the support span to bridge the distance between the card guide end coupled to the second card guide and the card receptor end removably attached to the second edge of the short printed circuit card.

30. An electronic system comprising:
a first card guide;
a second card guide opposing the first card guide, the first and second card guides adapted to support a full length printed circuit card;
a short card inserted into the electronic system, the short card having a card guide edge coupled to the first card guide and a first edge not coupled to a card guide in the electronic system; and
a support extending from the first edge of the short card into the second card guide of the electronic system.

31. The electronic system of claim 30, wherein the support is a short card support.

32. The electronic system of claim 31, wherein the short card support is an adjustable short card support.

33. The electronic system of claim 31, wherein the short card support includes a card guide end adapted to couple to the second card guide of the electronic system, a card receptor end adapted to couple with the first edge of the short card, and a support span connecting the card guide end and the card receptor end.

34. The electronic system of claim 33, wherein the card receptor end is width adjustable to accommodate varying thickness short cards.

35. The electronic system of claim 32, wherein a span length of the support is selectively adjustable in a range from approximately 10% to 90% of a length of a card bay of the electronic system.

36. The electronic system of claim 32, wherein a span length of the support is selectively adjustable in a range from approximately 2 to 6 inches.

37. The electronic system of claim 30, wherein the electronic system is a computer system.

* * * * *